US005418017A

United States Patent [19]

Ohmi

[11] Patent Number: 5,418,017

[45] Date of Patent: May 23, 1995

[54] METHOD OF FORMING OXIDE FILM

[76] Inventor: Tadahiro Ohmi, 1-17-301, Komegabukuro, 2-chome, Aoba-ku Sendai-shi, Miyagi-ken 980, Japan

[21] Appl. No.: 81,370

[22] PCT Filed: Dec. 27, 1991

[86] PCT No.: PCT/JP91/01799

§ 371 Date: Oct. 13, 1993

§ 102(e) Date: Oct. 13, 1993

[87] PCT Pub. No.: WO92/12274

PCT Pub. Date: Jul. 23, 1992

[30] Foreign Application Priority Data

Jan. 1, 1991 [JP] Japan .................................. 3-010008

[51] Int. Cl.$^{6}$ ................................................ B05D 3/06

[52] U.S. Cl. .................................... 427/528; 427/327; 427/399; 427/529; 427/533; 427/571

[58] Field of Search ............... 427/529, 571, 528, 327, 427/399, 533

*Primary Examiner*—Bernard Pianalto

*Attorney, Agent, or Firm*—Young & Thompson

[57] ABSTRACT

A method of forming an oxide film of a high quality 400° C. or below. Ions of an inert gas, whose kinetic energy is 90 or below eV, are applied on the surface of a material of a semiconductor, metal or alloy, and oxygen gas molecules are fed. Thereby, a thin oxide film of the material is formed on the surface of the material.

1 Claim, 2 Drawing Sheets

METHOD OF FORMING OXIDE FILM

FIELD OF THE INVENTION

The present invention relates to a method of forming oxide film.

BACKGROUND ART

Conventionally and presently, the formation of an oxide film on a semiconductor material surface or a metallic surface or an alloy surface has been conducted by means of heating this material to a temperature of 500° C. or more in an oxidizing atmosphere.

However, in cases, for example, in which, after the formation of various types of thin films on a semiconductor substrate, a portion of these various thin films is removed and the surface of the semiconductor substrate is exposed, and an oxide film is formed on the exposed surface, it is sometimes impossible to heat the substrate to a temperature of 400° C. or more, depending on the type of thin film. Furthermore, in the case of heating to a temperature 400° C. of more, reaction occurs between the films formed on the semiconductor substrate, and the quality of the films tends to worsen.

Accordingly, the development of a method of forming oxide films which enables the formation of a high quality oxide film at low temperatures of 400° C. or below has been desired.

It is an object of the present invention to provide a method for forming oxide films which is capable of forming high quality oxide films at temperatures of 400° C. or below.

SUMMARY OF THE INVENTION

In the method of forming oxide film of the present invention, which solves the problems above, ions of an inert gas, the kinetic energy of which is 90 eV or below, are applied to the surface of a semiconductor material, a metal material, or an alloy material, and oxygen gas molecules are supplied thereto, and thereby, a thin oxide film of the material is formed on the surface of the material.

DETAILED DISCUSSION

In the method of the present invention, for example, when the surface of a metal is struck by Ar ions, it is possible to activate the surface atomic layer without causing defects therein. Ions having an energy level of 25 eV penetrate the surface to a depth of 2–3 atoms, so that energy is applied only to the surface. Thus, it is possible to effectively raise the temperature of the metal surface. When oxygen gas is introduced into the film formation chamber simultaneously, the oxygen molecules and the oxygen radicals produced by discharge are adsorbed by the metal surface, and these react with the metal at the metal surface, which has been heated by means of Ar ion irradiation. By means of this, the oxidation of the metal is promoted.

Accordingly, it is possible to form a metal oxide film (for example, a $Ta_2O_5$ film) having a thickness of 5–10 nm without raising the substrate temperature to 400° C.; for example, such formation is possible at a temperature from 150°–200° C. If the energy of the ions which are applied is kept 90 eV or below, it is possible to avoid damaging lower layers.

Examples of devices for applying ions having an energy of 90 eV or below include, for example, the devices shown in FIGS. 1 and 2; it is preferable that $O_2$ gas and Ar gas be introduced into the device, that the frequency on the substrate side be 50 MHz, and that on the target side be 200 MHz, that the RF power be within a range of 10–50 W, and that plasma be generated within an atmosphere within a range of 1 mTorr–tens of mTorr.

BEST MODE FOR CARRYING OUT THE INVENTION

Hereinbelow, embodiments of the present invention will be explained.

(Embodiment 1)

Figure 1:
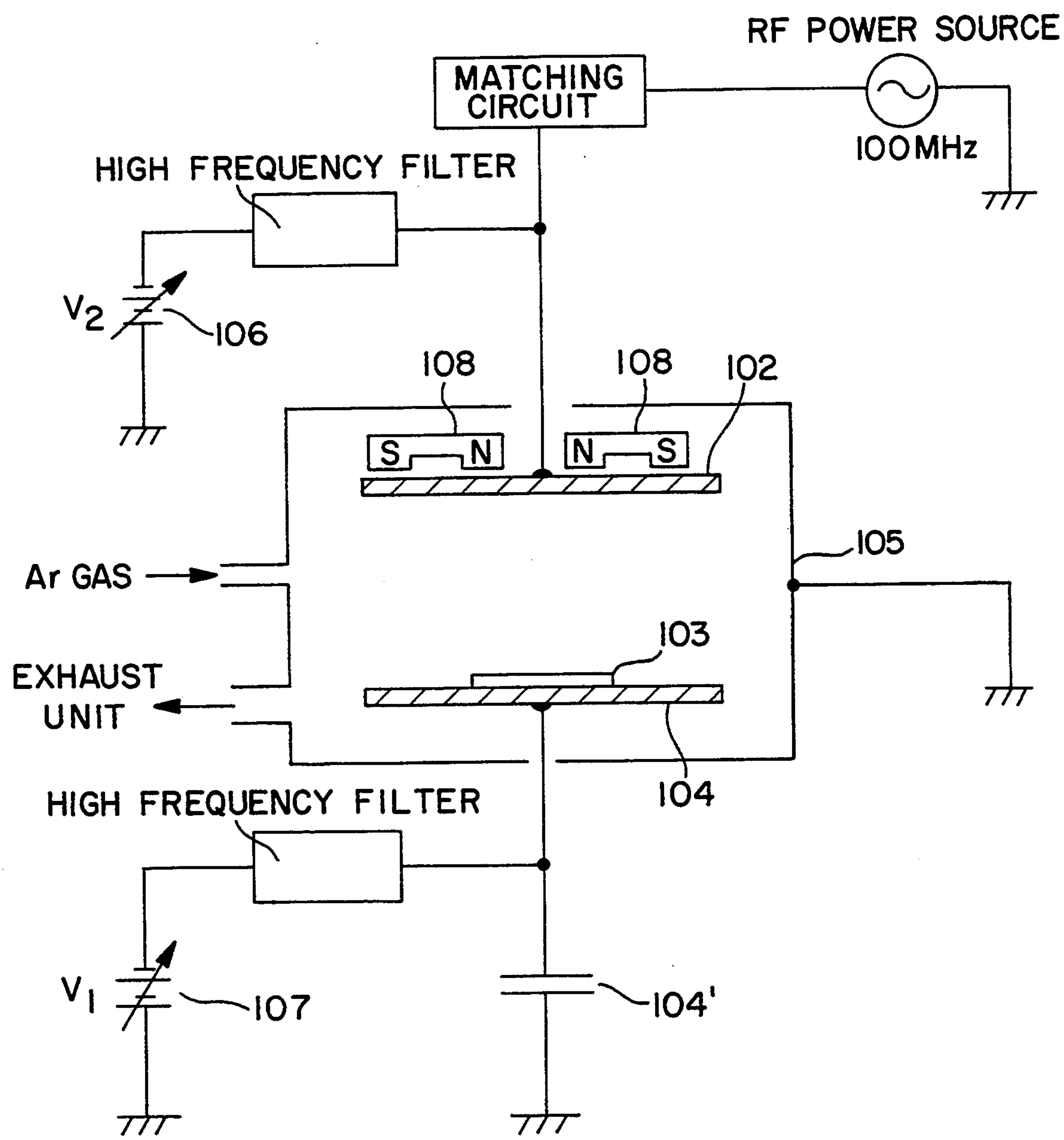
FIG. 1 shows an example of a device for oxide film formation used in the present invention.
Figure 2:
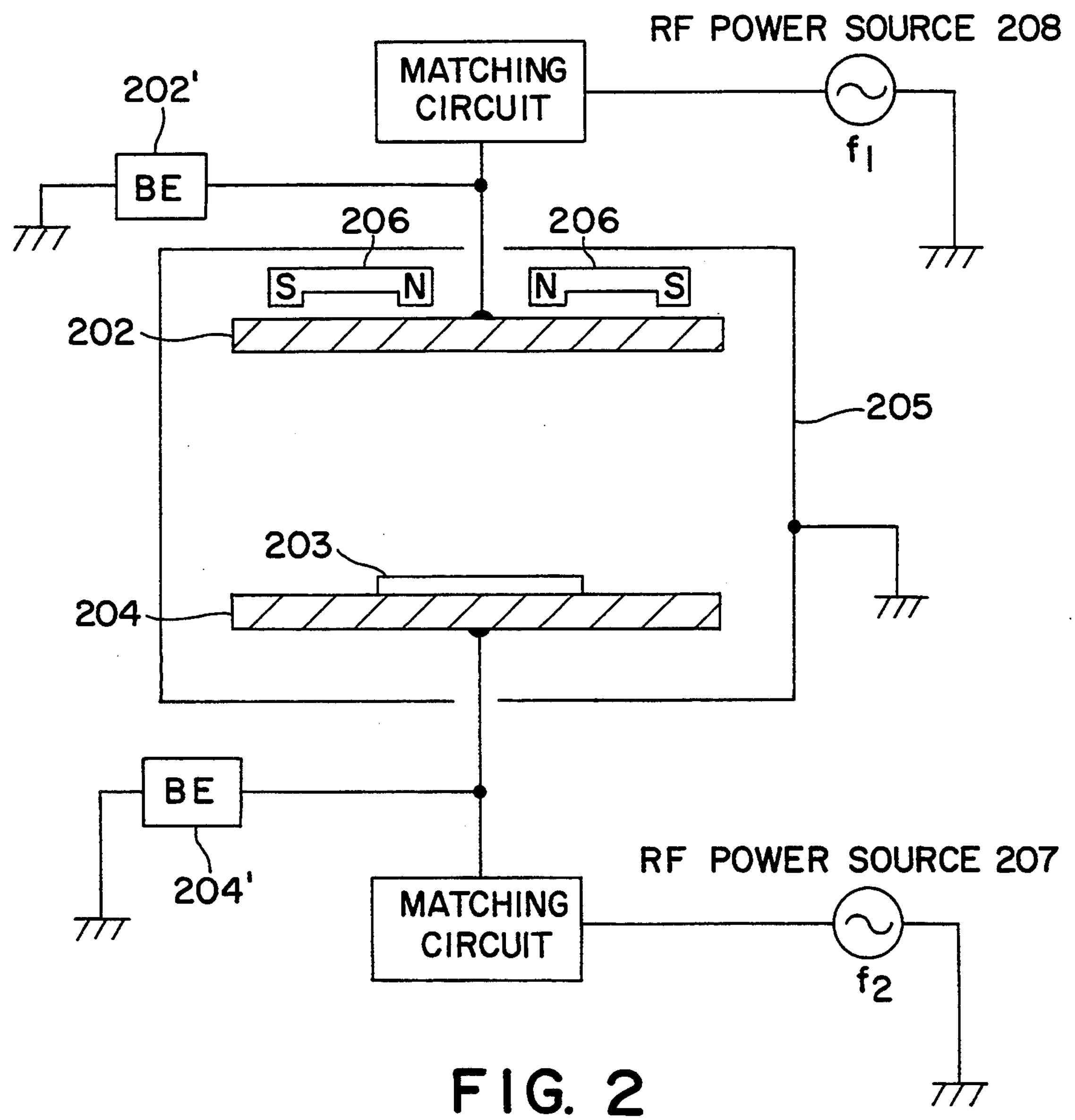
FIG. 2 shows an example of a device for oxide film formation used in the present invention.

In the present example, the device used in FIG. 2 was used, $O_2$ gas and Ar gas were introduced into the device, the frequency $f_2$ on the substrate side 204 was 50 MHz, the frequency $f_1$ on the target side was 200 MHz, the RF power was 2 W, and plasma was generated in an atmosphere within a range of 1 mTorr–tens of mTorr, and an oxide film was formed on the surface of a Si wafer 203. The $O_2$ gas was at a pressure of $10^{-3}$ Torr.

The temperature of the Si wafer 203 was maintained at 400° C., the time which elapsed until the formation of a 5 nm oxide film was measured, and was found to be approximately 30 minutes.

In contrast, a Si wafer was maintained at a temperature of 400° C. in an atmosphere of a gas containing HCl ($HCl/O_2$), which promotes oxidation, and the time which elapsed until the formation of an oxide film having a thickness of 5 nm was found to be approximately 30,000 hours.

In accordance with the present invention, it is possible to form an oxide film at a temperature of less than 400° C. without otherwise affecting film quality.

I claim:

1. A method of forming oxide film, wherein ions of an inert gas having a kinetic energy of 90 eV or below, are applied to the surface of a semiconductor material or a metal material, and oxygen gas is supplied thereto, and thereby, a thin oxide film of said material is formed on the surface of said material.

* * * * *